United States Patent

Blackmer

[11] 4,403,199
[45] Sep. 6, 1983

[54] GAIN CONTROL SYSTEMS

[75] Inventor: David E. Blackmer, Wilton, N.H.

[73] Assignee: DBX, Inc., Newton, Mass.

[21] Appl. No.: 247,829

[22] Filed: Mar. 26, 1981

Related U.S. Application Data

[63] Continuation-in-part of Ser. No. 131,220, Mar. 17, 1980, abandoned.

[51] Int. Cl.³ .......................... H03G 3/10; G06G 7/12
[52] U.S. Cl. .................................. 330/278; 328/145; 307/493
[58] Field of Search .............. 330/146, 263, 267, 278, 330/285; 328/143, 145; 307/492, 493, 500

[56] References Cited

U.S. PATENT DOCUMENTS 4,225,794 9/1980 Buff ...................................... 328/145

Primary Examiner—James B. Mullins
Assistant Examiner—Gene Wan
Attorney, Agent, or Firm—Schiller & Pandiscio

[57] ABSTRACT

An improved gain control circuit of the "eight transistor gain cell" type is disclosed. The improvements comprise (1) means for operating the circuit as a Class AB amplifier and (2) means for reducing the distortion component in the output signal due to the inherent parasitic base and emitter resistances of the transistors of the gain cell of the gain control circuit.

23 Claims, 6 Drawing Figures

GAIN CONTROL SYSTEMS

RELATED APPLICATIONS

This application is a continuation-in-part of my copending application Ser. No. 131,220 filed Mar. 17, 1980, now abandoned.

This invention relates to electronic multipliers or gain control circuits, and more particularly to analog multipliers with logarithmic control responses.

Many systems, especially those used for audio and video signals, include signal gain circuits controlled in response to an electrical command or gain control signal. One such gain control circuit, also referred to as a "voltage control amplifier" or "VCA," is described and claimed in U.S. Pat. No. 3,714,462 issued to David E. Blackmer on Jan. 30, 1973 (the claimed circuits hereinafter being collectively referred to as the "Blackmer circuit"). The Blackmer circuit has been commercially successful, particularly for use in audio noise reduction systems, commonly referred to as "companders."

The Blackmer circuit is an analog device providing a logarithmic control response. The circuit generally includes first signal converting means for providing a first signal which is logarithmically related to the input signal, and second signal converting means. The latter is connected to the first signal converting means so as to provide an output signal which is an anti-logarithmic function of the sum of the first signal and the gain control signal. More specifically, the Blackmer circuit comprises an input operational amplifier having a pair of feedback paths, one being conductive when the input signal is of a positive polarity, the other being conductive when the input signal is of a negative polarity. In the preferred form of the Blackmer circuit, each feedback path includes a log device for converting the input signal of the correct polarity into a log form. Each log device in each path has connected to it an antilog device for converting the log signal together with the gain control signal in an antilog form. For want of a better expression the signal path defined between the input of each log device and the output of the corresponding antilog device to which the log device is coupled shall hereinafter be referred to as the "log-antilog transmission path". The log devices are preferably bipolar transistors of opposite conductivity types, i.e. PNP and NPN transistors for the respective polarities of the input signal, since such circuits can be connected to exhibit log-linear transfer characteristics. Similarly, the antilog devices are also typically emitter-collector circuits of transistors of opposite conductivity types, since such circuits can also be connected to exhibit antilog-linear transfer characteristics. A control signal is summed with the log signal of each path by applying the voltage to the bases of the log and the antilog transistors, thereby controlling the gain of the circuit.

Although the Blackmer circuit, employing the four transistors as log and antilog devices (hereinafter referred to for convenience as the "primary" transistors) theoretically provides substantially zero distortion, as a practical matter commercially available transistors are not perfect. Thus, the output of the circuit may include some detectable distortion, although in the case of audio applications, it may not be readily discernable to the average listener. This distortion can be attributed, at least in part, to the combination of two inherent characteristics of the primary transistors: (1) each transistor has a finite current gain and (2) each transistor exhibits inherent and nonzero or parasitic base and emitter resistances. As a result of the finite current gain, when a current is provided into the collector of a transistor, the resulting base current provided into the base of the transistor creates a voltage drop across the parasitic base resistance. Further, the emitter current provided in response to the collector current creates a voltage drop across the parasitic emitter resistance of the transistor. These voltage drops vary the internal (actual) base-emitter junction voltage with current, causing a distortion component to be generated. Where the log converting and antilog converting transistors of each signal path are matched, at unity gain the voltage errors contributed by the log and antilog transistors of each signal path are equal and opposite and will cancel one another. However, as the gain shifts from unity gain, the amount of current in the log converting transistors differs from that in the antilog converting transistors and the deviations from log performance are not equal and thus will not cancel each other. The error voltage at the bases and emitters of these devices can be thought of as another control voltage signal which varies the gain of the circuit as the signal is changing.

Various techniques have been proposed to correct for this distortion. One suggested technique described in U.S. Pat. No. 4,234,804, issued to Bergstrom on Nov. 18, 1980, modifies the Blackmer circuit by incorporating means disposed outside of the log-antilog transmission paths for generating an error correction signal derived from a comparison of the output and input signals of the Blackmer circuit and means for summing the error correction signal with the control signal and the log signal. By adding in the error correction signal, the distortion component in the output is reduced.

Another source of distortion in the Blackmer circuit results from the fact that log slope errors can exist between the NPN transistors of one path and the PNP transistors of the other path. While various correction schemes have been proposed, a suggested technique now being commercially exploited, incorporates into the emitter path of each primary log and antilog transistor of the Blackmer circuit a diode element so as to form four compound log and antilog devices. For convenience this circuit shall be referred to hereinafter as the "four-transistor, four-diode cell VCA." To form the four-transistor, four-diode cell VCA, the emitter of each primary transistor of the Blackmer circuit is connected to a secondary transistor, the latter being connected so as to operate in a diode mode. The secondary diode-connected transistors are of an opposite conductivity type as the corresponding primary transistors to which they are connected so that the emitters of the log and antilog NPN primary transistors of one log-antilog transmission path are connected to the corresponding emitters of PNP secondary diode-connected transistors, and the emitters of the log and antilog PNP primary transistors of the other log-antilog transmission path are connected to the corresponding emitters of NPN secondary diode-connected transistors. The PNP secondary transistors are connected with their bases and collectors tied together and to a first current source. The NPN secondary diode-connected transistors are connected with their bases and collectors tied together and to a second current source. The first and second current sources are connected to receive the output of an input operational amplifier of the circuit, the inverting input of which receives the current signal input of the circuit and the positive input of which is connected to system ground. As the input signal current varies, the relative magnitudes of the currents provided by the current sources to the corresponding pair of secondary diode-connected transistors vary with respect to one another but the sum of the currents provided by the current sources always remains substantially constant. By maintaining the sum of the currents substantially constant, various distortions, including those attributed to the parasitic base and emitter resistances are reduced.

An improvement over the four-transistor, four-diode cell VCA is described in U.S. patent application Ser. No. 131,220 filed by Robert W. Adams on Mar. 17, 1980 (which is hereafter referred to as the Adams application) and now U.S. Pat. No. 4,331,931, issued May 25, 1982, which application is a continuation of U.S. Ser. No. 90,328 filed Nov. 1, 1979 (both applications having been assigned to the present assignee). The Adams application, now abandoned describes and claims a gain control circuit comprising secondary amplification means disposed in each log-antilog transmission path. Providing signal gain in each transmission path reduces the requirements of the input amplifier and increases the gain bandwidth product over that provided by the four-transistor, four-diode cell VCA.

The embodiment described in the Adams application is a Class A push-pull eight transistor gain cell VCA. More specifically, four secondary transistors are connected to the corresponding emitters of the primary transistors so as to form compound log and antilog devices, each compound device preferably including a pair of transistors each connected to provide signal amplification during signal conversion. In the preferred embodiment the gain provided by the secondary transistors is a function of the input signal to the circuit. Each secondary transistor is of a conductivity type opposite to that of the primary transistor to which it is paired. The bases of the secondary transistors of one transmission path are tied together, to the output of the input operational amplifier. The remaining secondary transistors, i.e., those of the other transmission path, have their collectors connected together and to the input of a differential current gain stage and their bases connected together and to the output of the gain stage. As described in the Adams application, as long as the quiescent current levels remain at least twice the maximum expected current level in response to the maximum input level, the sum of the biasing currents through the emitters of the primary transistors remain substantially constant.

Although the Class A push-pull eight transistor gain cell VCA disclosed in the Adams application is an improvement over the four-transistor, four-diode cell VCA, there are applications when the use of a Class AB amplifier is more desirable. These include circuits requiring low output offset currents and circuits in which noise levels must be kept at an absolute minimum.

Accordingly, one object of the present invention is to provide a Class AB gain control circuit having some of the advantages of the eight transistor gain cell VCA of the Adams application.

It is another object of the present invention to reduce the distortion produced in the eight transistor gain cell.

These and other objects are achieved by an improved gain control circuit of the eight transistor gain cell type. The improvements comprise (1) means for operating the circuit as a Class AB amplifier with a controlled quiescent biasing current and (2) means disposed in each log-antilog transmission path for providing compensation as a function of the input signal current and the output signal current of the circuit so as to reduce the distortion in the output signal of the circuit.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings wherein:

FIG. 6 shows the embodiment of FIG. 4 modified for operation as a Class A amplifier.

Referring to the drawings, like numerals are used to describe like parts throughout the figures.

Figure 1:
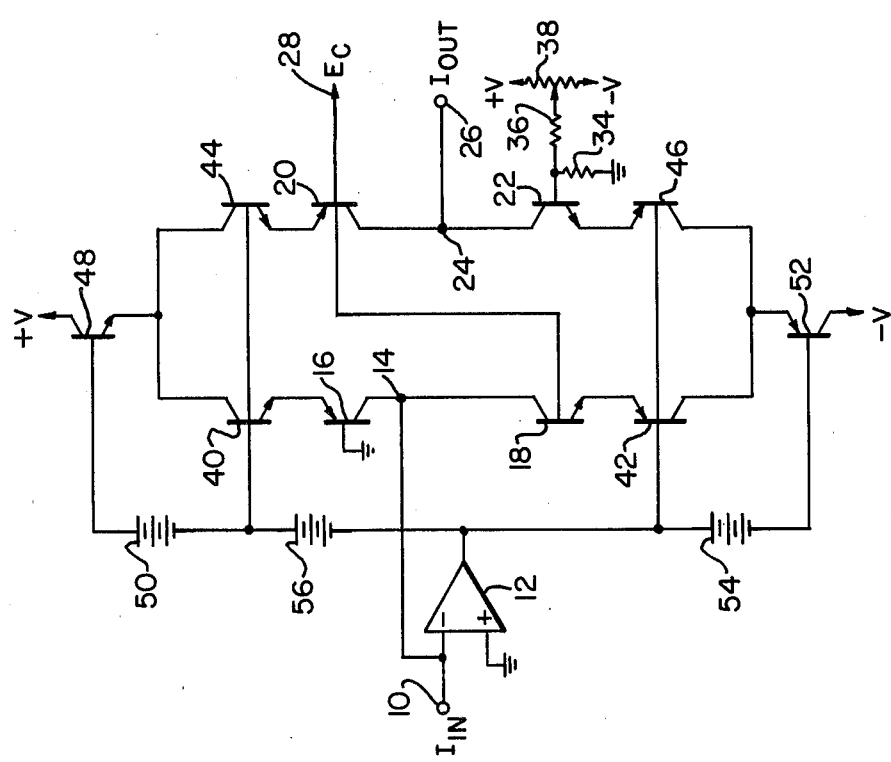
FIG. 1 shows a first embodiment of the gain control circuit operable as a Class AB amplifier.

In FIG. 1, the input signal current is applied to current input terminal 10 of the gain control circuit shown. Terminal 10 is shown connected to the negative input terminal of operational amplifier 12, the latter having its positive input connected to ground and its negative input connected to the input junction 14 which forms the input to the gain cell defining the two log-antilog transmission paths of the circuit. Input junction 14 is formed by the connection of the two collectors of the primary log transistors 16 and 18, the first being a PNP transistor while the latter being an NPN transistor. The collectors of the primary antilog transistors 20 and 22 are joined at output junction 24 so as to form the current output terminal 26. As will be more evident hereinafter log transistor 16 and antilog transistor 20, in part define one log-antilog transmission path, while log transistor 18 and antilog transistor 22 in part define the other log-antilog transmission path. The gain control signal Ec is applied to the control signal input terminal 28. The latter is connected to the bases of a log transistor of one log-antilog transmission path and an antilog transistor of the other path. As shown the connection is made to the bases of primary transistors 18 and 20.

In order to provide symmetry among the primary transistors 16, 18, 20 and 22, the base of the antilog transistor which does not receive the control voltage, i.e. transistor 22, is connected through resistor 34 to ground, and through resistor 36 to a variably adjustable DC voltage source 38; while the base of the remaining log transistor, i.e. transistor 16, is grounded. As is well known, adjustment of source 38 provides the desired symmetry to correct for the sum of the transistor device $V_{be}$ mismatches in one log-antilog transmission path as compared with the transistor device mismatches in the other log-antilog transmission path.

To the extent described, the emitters of transistors 16 and 20 and the emitters of transistors 18 and 22 would be coupled together to form the Blackmer circuit. However, in accordance with the invention described and claimed in the Adams application, the Blackmer circuit is modified such that amplification means, in the form of secondary log and antilog transistors 40, 42, 44 and 46 are each connected to a corresponding emitter of a primary transistor and connected within the circuit so as to provide signal gain in each log-antilog transmission path.

More particularly, the emitter of each primary log transistor 16 and 18 is connected to the emitter of the respective secondary log transistor 40 and 42 with each secondary log transistor being of a conductivity type opposite to that of the primary log transistor to which it is paired. Similarly, the emitter of each primary antilog transistor 20 and 22 is connected to the emitter of the respective secondary antilog transistor being of a conductivity type opposite to that of the primary antilog transistor to which it is paired. The secondary log and antilog transistors of each log-antilog transmission path have their collectors tied together, and their bases connected together. This results in what has been referred to and is described in the Adams application as an "eight transistor gain cell VCA" wherein compound log transistors and compound antilog transistors are provided in each log-antilog transmission path. The embodiment of the eight transistor gain cell described in the Adams application operates as a Class A amplifier. Biasing currents, the sum of which remains substantially constant, are provided through the emitters of the primary transistors with the quiescent levels of the biasing currents being at least twice the maximum expected levels of the transmitted signals in response to the maximum input level. In this manner current flows through the transistors through the entire input cycle and no distortion due to cross-over is produced.

In accordance with one aspect of the present invention, a Class AB gain control circuit including the eight transistor gain cell is provided. Referring to FIG. 1, in order to provide Class AB operation, the junction of the collectors of the secondary transistors 40 and 44 and the junction of the collectors of the secondary transistors 42 and 46 are each connected to a low impedance voltage source which is derived from transistors operated to maintain a collector base voltage substantially independent of the respective desired biasing and signal currents. As shown, the junction of the collectors of secondary transistors 40 and 44 are connected to the emitter of NPN transistor 48, the latter having its collector connected to a positive voltage potential and its base connected to the positive side of a DC voltage source 50. Similarly, the tied collectors of secondary transistors 42 and 46 are connected to the emitter of PNP transistor 52, the latter having its collector connected to a negative voltage potential and its base connected to the negative side of a DC voltage source 52. The positive side of source 54 is connected to the output of the input operational amplifier 12. The output of amplifier 12 is in turn connected to the negative side of DC source 56. The negative side of source 50 and the positive side of source 56 are connected to the bases of secondary transistors 40 and 44, while the bases of secondary transistors are connected to the positive side of source 54 and the negative side of source 56. Sources 50 and 54 provide sufficient bias to operate transistor 48 and 52 to maintain the collector voltages of transistors 40, 42, 44 and 46 near their base voltage to minimize junction heating in the latter set of transistors as the resultant thermal gradients may cause significant gain error and distortion.

Preferably, the DC voltage sources 50 and 54 are connected to a suitable current drive (not shown) in order to produce the desired voltage drop across each of the diode-connected transistors. Source 56 is preferably a transistor connected in a diode-mode, matched for its Vbe/Ic transfer characteristics with those of the eight transistors of the gain cell. The voltage potential provided by source 56 is such that the base of each of the secondary transistors 40, 42, 44 and 46 is provided with a bias voltage so as to produce a quiescent current (i.e., when the input current at input terminal 10 is zero) through the collector-emitter paths of the primary transistors 16, 18, 20 and 22 and secondary transistors 40, 42, 44 and 46. So long as the input current at terminal 10 is zero and the input bias current of amplifier 12 is zero, an equal quiescent current flows through each of the transistors 40, 16, 18 and 42 and each of the transistors 44, 20, 22 and 46 and the current output at terminal 26 is zero. The amplitude level of the quiescent current is set well below that of the expected maximum input current in order to provide Class AB operation.

In operation, when the input signal current at input terminal 10 is of a first representation, e.g. of a positive polarity, the positive input current is applied to junction 14. As the input current at terminal 10 goes positive, the input voltage at the negative input terminal of the input operational amplifier 12 goes positive, resulting in the output of the amplifier going negative. As the output of amplifier 12 goes negative the secondary transistors 18, 42, 46 and 22 become more conductive since a negatively increasing output of amplifier 12 results in a negatively increasing voltage on the base of transistors 42 and 46 and therefore an increase in the base-emitter voltage applied to the primary and secondary transistors 18, 42, 46 and 22. Thus, more current flows through transistors 18, 22, 42 and 46. Simultaneously, the output of the operational amplifier 12 results in the primary and secondary transistors 16, 40, 44 and 20 becoming less conductive. As the input current at terminal 10 increases, and the output of operational amplifier 12 becomes more negative, the transistors 18, 42, 22 and 46 become fully conductive and transistors 16, 40, 44 and 20 become substantially nonconductive. Thus, the log-antilog transmission path defined by transistors 18, 42, 22 and 46 provides a signal at the output terminal 26 which is an antilogarithm function of the sum of the DC control signal Ec applied to terminal 28 and a signal which is a logarithmic function of the input signal.

Conversely, when the input signal current at the input terminal 10 is of an inverted representation, i.e., a negative polarity, the negative input current is applied to the junction 14. As the input current at terminal 10 goes negative, the voltage input to operational amplifier 12 goes negative, resulting in the output of the amplifier going positive. As the output of the amplifier 12 goes positive the secondary transistors 40 and 44 and primary transistors 16 and 20 become more conductive since a positively increasing output of amplifier 12 results in a positively increasing voltage on the base of transistors 40 and 44 and therefore an increase in the base-emitter voltage applied to the secondary transistors 40 and 44 and primary transistors 16 and 20. Thus, more current flows through transistors 16, 20, 40 and 44. Simultaneously, the output of the operational amplifier 12 results in the secondary transistors 42 and 46 and primary transistors 18 and 22 becoming less conductive. As the negative input current at terminal 10 becomes more negative and the output of operational ammplifier 12 becomes more positive, the transistors 40 and 44 become fully conductive and transistors 42 and 46 become substantially nonconductive. Consequently, the log-antilog transmission path defined by transistors 16, 40, 20, and 44 provide a signal at the output terminal 26 which is an antilogarithmic function of the sum of the DC control signal Ec applied to terminal 28 and a signal which is a logarithmic function of the input signal. The device as described thus provides class AB operation.

Another aspect of the present invention is described with respect to FIGS. 2-6. More particularly, the eight transistor gain cell shown includes modification means disposed in the long-antilog transmission path for providing compensation derived from the input and output signals so as to substantially reduce or cancel the distortion components in the output signal attributable to the inherent parasitic base and emitter resistances of the transistors in each of the log-antilog transmission paths. Preferably, compensation is provided for separately correcting for the errors of each pair of log transistors and each pair of antilog transistors of each path directly as a function of each pair's own errors (one implementation of FIG. 2) or for correcting for difference errors between each pair of log transistors and the corresponding pair of antilog transistors of the same log-antilog transmission path as the gain varies from unity (another implementation of FIG. 2 and FIGS. 3-6).

Figure 2:
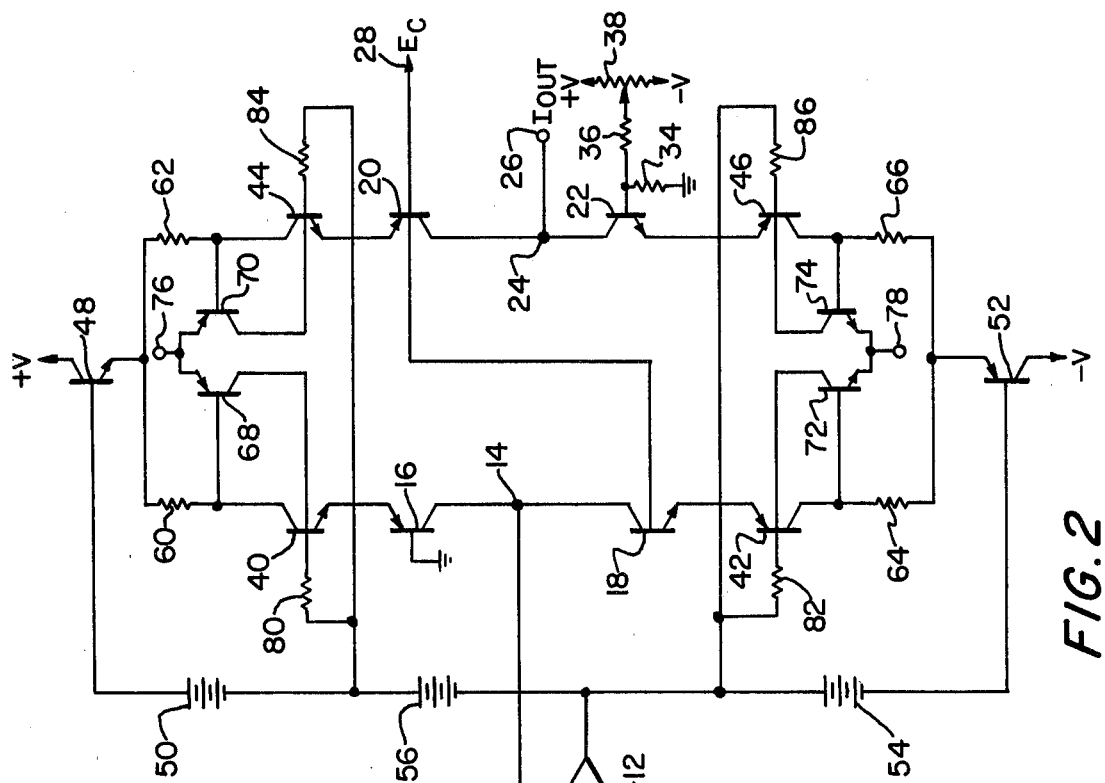
FIG. 2 shows an embodiment of a gain control circuit including means for providing compensation to reduce distortion due to the inherent parasitic base and emitter resistances of the primary and secondary transistors of the eight transistor gain cell.

Referring to FIG. 2, the means for providing such error compensation is shown in use with the Class AB gain circuit of FIG. 1. Specifically, resistors 60 and 62 are respectively connected between the collector of secondary transistor 40 and the emitter of transistor 48, and between the latter and the collector of secondary transistor 44. Similarly, resistors 64 and 66 are respectively connected between the collector of secondary transistor 42 and the emitter of transistor 52 and between the latter and the collector of secondary transistor 46. As will be more evident hereinafter, where the NPN transistor of the cell are matched and the PNP transistors are similarly matched, resistors 60, 62, 64 and 66 (as shown in FIGS. 2-6) are equal. The current flowing through the resistor 60 will respectively be a function of the biasing current and the input current $I_{in}$ when the latter is of a negative polarity. Similarly, the currents flowing through resistors 62, 64 and 66, will respectively be a function of (1) the biasing current and the output current $I_{out}$ when the latter is negative, (2) the biasing current and the input current $I_{in}$ when the latter is positive and (3) the biasing current and the output current $I_{out}$ when the latter is positive. Consequently, the voltage drop across (1) resistors 60 and 62 will be respectively proportional to the input and output signals, when the latter are of a negative polarity and (2) resistors 64 and 66 will be respectively proportional to the input and output signals when the latter are of a positive polarity. Thus, at unity gain when the input and output currents are equal the voltages generated across resistors 60 and 62 or across resistors 64 and 66 are equal. In FIG. 2, the correction signals are preferably derived by detecting the current or voltage levels at the collectors of the secondary transistors and providing correction signals responsively thereto so that correction can be provided without affecting those levels as will be more evident hereinafter.

In FIG. 2, the embodiment shown can be utilized to generate a correction signal through each pair of log or antilog transistors in response to the detected collector voltage of its own secondary transistor so as to provide for its own correction. In this approach, means are provided for measuring the collector voltage levels of transistors 40 and 44 and the collector voltage levels of transistors 42 and 46 and for providing compensation to each pair of log or antilog transistors as a function of the voltage level detected from the secondary transistor of that pair. The means for measuring the collector voltage levels includes a pair of transistors 68 and 70 for the negative log-antilog transmission path and a pair of transistor 72 and 74 for the positive log-antilog transmission path.

The transistors 68 and 70 are preferably PNP type transistors having their bases respectively connected to the collectors of secondary transistors 40 and 44, their emitters connected together and to a voltage source at terminal 76 and their collectors respectively connected to the bases of secondary transistors 40 and 44. Similarly, the transistors 72 and 74 are preferably NPN type transistors having their bases respectively connected to the collectors of secondary transistors 42 and 46, their emitters connected together and to a voltage source at terminal 78 and their collectors respectively connected to the bases of secondary transistors 42 and 46. Resistors shown at 80, 82, 84 and 86 are respectively inserted between the corresponding base of secondary transistors 40, 42, 44 and 46 and the corresponding point to which the bases are connected in the FIG. 1 embodiment.

When the circuit operates at unity gain, the input current signal through resistor 60 or 64 equals the output current signal through resistor 62 or 66. As a consequence for a negative input signal, the currents through resistors 60 and 62 will be equal and the voltage level on the collectors of transistors 40 and 44 will be identical. As a result the same voltage will be provided to the base of transistors 68 and 70 and the same compensating currents will flow through their respective collectors to the corresponding bases of transistors 40 and 44. The compensating current provided by transistors 68 and 70 are converted to voltages across resistors 80 and 84 so as to be subracted from the signals provided in the respective log and antilog positions of the transmission paths. Since the PNP transistors 16 and 20 are matched for their Vbe/Ic characteristics and the NPN transistors are similarly matched, at the same current levels the errors generated in the log transistors 16 and 40 will be substantially the same errors generated in the antilog transistors 20 and 44. Similarly, for positive input signals at unity gain the currents through resistors 64 and 66 are equal and the compensating signals subtracted from the log and antilog signals are the same.

When the gain shifts from unity for negative input signals a greater current will flow through one of the resistors 60 and 62 resulting in a greater voltage level being applied to the bases of the corresponding transistors 68 and 70. The collector currents of transistor 68 and 70 are each a function of the base voltage applied so that a compensating signal is applied to the base of the secondary transistor as a direct function of its collector voltage. This is consistent with the fact that the greater the current signal level at the collector, the greater the amount of error contributed by the parasitic base and emitter resistances of the primary and secondary resistors. A similar result occurs for positive input signals at gains other than unity, with respect to the operation of transistors 72 and 74. Thus, the correction signal provided through each pair of log or antilog transistors is provided by the detected collector voltage (as generated across the appropriate resistor 60, 62, 64 and 66) of its own secondary transistor so as to provide for its own corrections.

The FIG. 2 embodiment can easily be modified so that compensation is provided by correcting for difference errors between each pair of log transistors and the corresponding antilog transistors of the same path. Specifically, terminals 76 and 78 are connected to current sources (not shown) so that each pair of transistors 68 and 70 and transistors 72 and 74 each function as a differential pair. As such the correction signal provided on the collectors of transistors 68 and 70 or transistors 72 and 74 are respectively a function of the voltage differential between the voltage across resistor 60 and the voltage across resistor 62, or a function of the voltage differential between the voltage across resistor 64 and the voltage across resistor 66.

Thus, at unity gain, when the input signal equals the output signal, the same voltage will be generated across resistors 60 and 62 or across resistors 64 and 66. The voltage differential will therefore be equal to zero and the collector currents of transistors 68 and 70 or transistors 72 and 74 will be the same.

When the gain shifts from unity gain for negative input signals a greater amount of current will flow through one of the resistors 60 and 62 with respect to the current flowing through the other since the current flowing through resistor 60 is a function of the input current and the biasing current in transistor 40, the current flowing through resistor 62 is a function of the output current and the biasing current in transistor 44 and at nonunity gain the output current does not equal the input current. Thus, a voltage potential differential exists between the collector of transistor 40 and the collector of transistor 44 as a function of the difference between the input and output currents. This voltage potential differential produces a difference in the current outputs of transistors 68 and 70 to the bases of transistors 40 and 44. This current differential is converted to a difference in voltages across resistor 80 or 84. The current output of transistors 68 and 70 thus respectively provide correction signals to the compound log transistors 16 and 40 and compound antilog transistors 20 and 44. The correction signals are subtracted from the respective signals at the bases of transistors 40 and 44 to substantially reduce or cancel the voltage errors provided by the inherent parasitic base and emitter resistances of the transistors 16, 20, 40 and 44. A similar result occurs for positive input signals at nonunity gain in the other log-antilog transmission path defined by transistors 18, 22, 42 and 46 wherein a voltage potential existing between the collectors of transistors 42 and 46 produces a difference in the current outputs of transistors 72 and 74 to the bases of transistors 42 and 46. The current differential is converted to different voltages across resistors 82 and 86 which are subtracted from the respective signals at the bases of transistors 42 and 46 to substantially reduce or cancel the voltage errors provided by the inherent parasitic base and emitter resistances of transistors 18, 22, 42 and 46.

The currents or voltages from sources 76 and 78 are each adjusted to provide precisely the gain between the signals from the collectors of transistors 40 and 44 and the collectors of transistors 42 and 46 to impress the required magnitude of the correction signal across resistors 80, 82, 84 and 86. This is especially useful in integrated circuits where the terminals 76 and 78 can be connected to external sources so as to permit easy adjustment.

Figure 3:
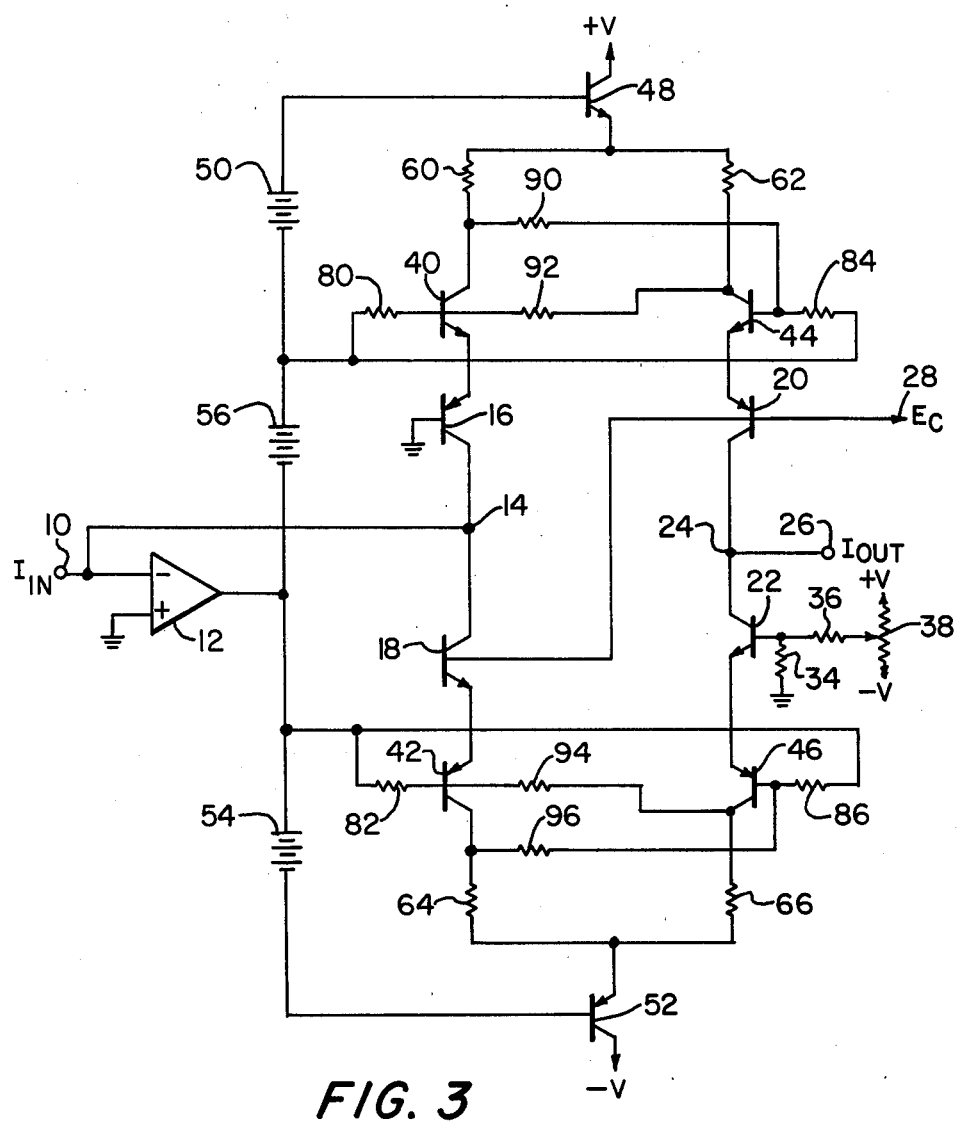
FIG. 3 shows an alternative embodiment to the embodiment shown in FIG. 2.

In the alternative arrangement shown in FIG. 3, transistors 68 and 70 and source 76 can be replaced with a pair of cross-coupled resistors 90 and 92. Resistor 90 is connected between the collector or transistor 40 and the base of transistor 44. Resistor 92 is connected between the base of transistor 40 and the collector of transistor 44. Similarly, transistors 72 and 74 and source 78 are replaced by cross-coupled resistors 94 and 96. Resistor 94 is connected between the base of secondary transistor 42 and the collector of transistor 46, and resistor 96 is connected between the base of secondary transistor 46 and the collector of transistor 42.

In this circuit configuration, the value of resistor 60 is made equal to the effective parasitic resistance $R_Q$ (appearing in the emitter path of transistor 40 and contributed by the parasitic base and emitter resistances of transistors 40 and 16) divided by the ratio of the value of resistor 80 to the sum of resistors 80 and 92. Since the NPN transistors are substantially matched to one another and similarly the PNP transistors are matched, resistor 80 equals resistor 84, resistor 90 equals resistor 92, and resistor 62 equals resistor 60. Resistors 64, 66, 82, 86, 94 and 96 are set in a similar manner.

At unity gain equal currents flow through resistors 60 and 62 or through resistors 64 and 66 and the base voltages on transistors 40 and 44 or transistors 42 and 46 will be the same. Accordingly, the potential across the voltage divider comprising resistors 84 and 90 and applied to the base of transistor 44 will substantially equal that across the voltage divider comprising resistors 80 and 92 applied to the base of transistor 40, and the potential across the voltage divider comprising resistors 94 and 82 and applied to the base of transistor 42 will substantially equal the potential across the voltage divider comprising resistors 96 and 86 and applied to the base of transistor 46. As the gain changes from unity gain, the input and output currents are different from one another. Depending on the polarity of the input signal, the voltage drop across resistor 90 will be different from the voltage drop across resistor 92 and the voltage drop across resistor 94 will be different from that across resistor 96 due to the respective voltage differentials between the collectors of transistors 40 and 44 and between the collectors of transistors 42 and 46. The current differential is again converted to a voltage on the base of the appropriate secondary transistor where it is added to the log signal so as to cancel or substantially reduce the distortion component due to the inherent resistances of transistors 16, 18, 20 , 22, 40, 42, 44 and 46. The FIG. 3 embodiment has the further advantage over the FIG. 2 embodiment in that any mismatching between transistors 40 and 44 and between transistors 42 and 46 can respectively be compensated for by adjusting the relative values of resistors 90 and 92 and the relative values of resistors 94 and 96.

Figure 4:
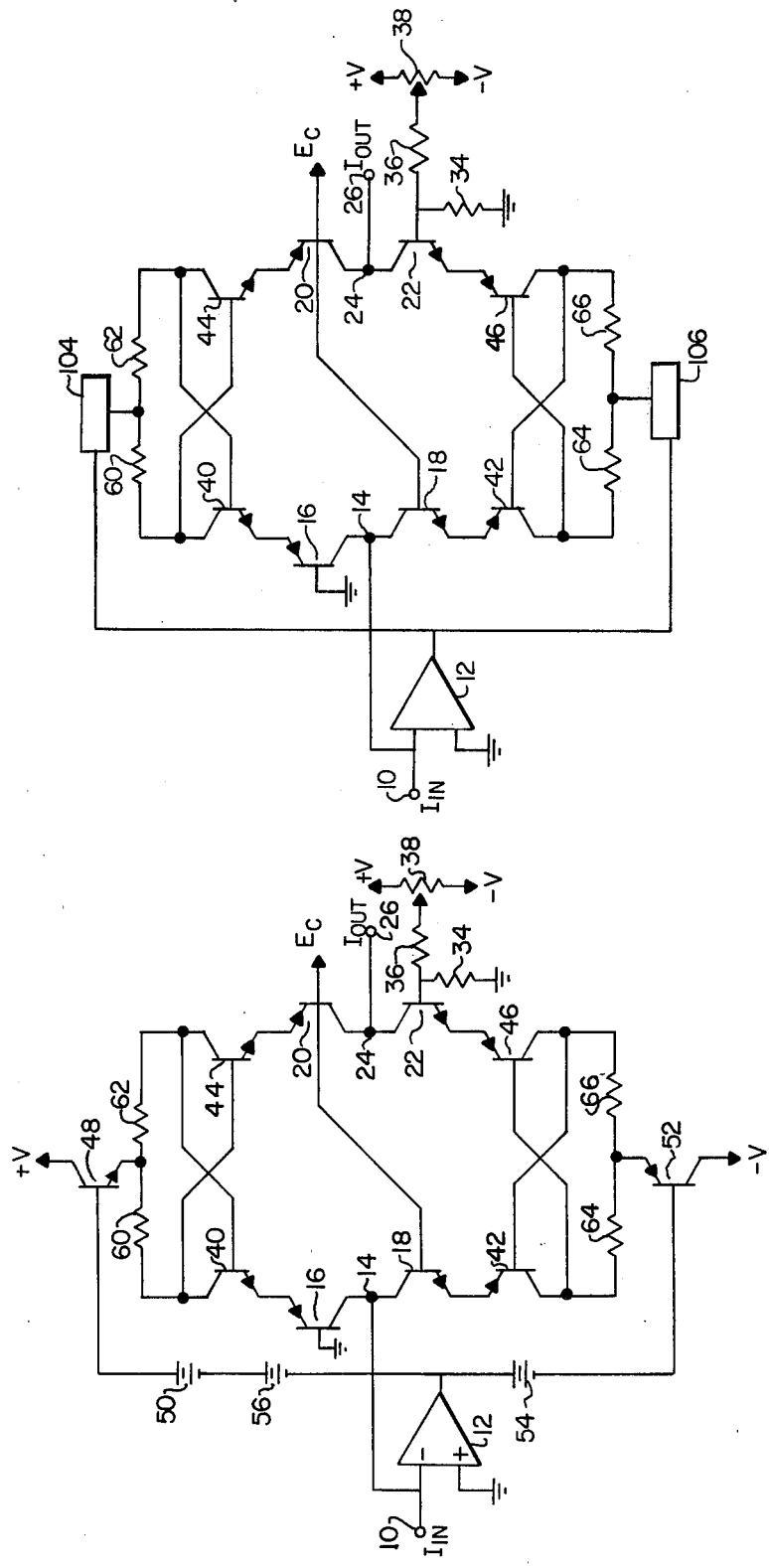
FIG. 4 shows an embodiment of the present invention biased for Class AB operation and providing in the preferred manner compensation to reduce distortion due to the inherent parasitic base and emitter resistances of the transistor of the eight transistor gain cell.

The preferred arrangement for providing signal correction for voltage errors introduced by parasitic base and emitter resistances of the transistors 16, 18, 20, 22, 40, 42, 44 and 46 is shown in FIG. 4 which is particularly adapted for use in integrated circuit form. In particular, in integrated circuit form, problems can be encountered with base currents on the PNP transistors 42 and 46, since the latter have a low current gain (Hfe) which may not be predictable. By connecting resistors 82 and 86 to the respective bases of transistors 42 and 46 as shown in FIG. 3 one increases the amount of correction signal necessary to provide the necessary compensation. Further, it is preferred to keep circuit complexity and adjustment procedures as simple as possible in order to keep chip size down and yield up. Economic considerations limit the number of pins on an IC chip causing external adjustment of distortion, such as that utilized in the FIG. 2 embodiment, to be less practical.

More specifically, the FIG. 3 embodiment becomes satisfactory for low Hfe PNP transistors in integrated form if resistors 94 and 96 are reduced to zero ohms and resistors 82 and 86 are made infinite. In a similar manner resistors 90 and 92 are reduced to zero ohms and resistors 80 and 84 are made infinite. Thus, the collector and base of transistor 40 are respectively connected directly to the base and collector of transistor 44, and the collector and base of transistor 42 are respectively connected directly to the base and collector of transistor 46. The connection between the bases of transistors 40 and 44 and the biasing sources 50 and 56 is disconnected thereby eliminating resistors 80 and 84. Similarly, the connection between the bases of transistors 42 and 46 and the biasing sources 54 and 56 is disconnected thereby eliminating resistors 82 and 86.

As in the previous embodiments, all of the NPN transistors are substantially matched for their Vbe/Ic transfer characteristics and all of the PNP transistors are substantailly matched for their Vbe/Ic transfer characteristics.

It can be easily seen that this circuit configuration of FIG. 4 provides the optimum relationship of resistance values of resistors 60, 62, 64 and 66. In particular, in FIG. 3 resistor 60 is made equal to $R_Q$ of transistors 40 and 16 divided by the ratio of (1) the value of resistor 80 with respect to (2) the sum of resistors 80 and 92. By making resistor 80 infinite and resistor 92 equal to zero, the value of resistor 60 is made equal to $R_Q$ which is typically between one and ten ohms. Resistors 62 is made equal to resistor 60, and resistors 64 and 66 are made equal to one another and to the $R_Q$ in the tied emitter paths of transistors 18 and 42 and the tied emitters paths of transistors 22 and 46.

As in FIG. 3, at unity gain equal currents flow through resistors 60 and 62 or through resistors 64 and 66 and the base voltages on transistors 40 and 44 or transistors 42 and 46 will be the same. As the gain changes from unity gain, the input and output currents flowing through resistors 60 and 62 or 64 and 66 (depending upon the polarity of the input signal) will be different from one another. Since the resistors 60, 62, 64 and 66 are set at $R_Q$, a different voltage drop will appear across resistor 60 from that across resistor 62 (or depending upon the polarity of the input signal across the resistor 64 from that across resistor 66). However, since (1) the input and output currents are also generating differential error signals in the transistors due to $R_Q$ (i.e., the parasitic base and emitter resistances), and (2) resistors 60, 62, 64 and 66 are all made equal to the respective $R_Q$s, the differential signals generated across resistors 60 and 62, or resistors 64 and 66 will be equal to the error signal otherwise appearing in the transistors. By applying the differential signal provided across resistors 60 and 62 or resistors 64 and 66 to the respective cross-coupled bases of transistors 44 and 40 or transistors 46 and 42, the error signal is cancelled.

Figure 5:
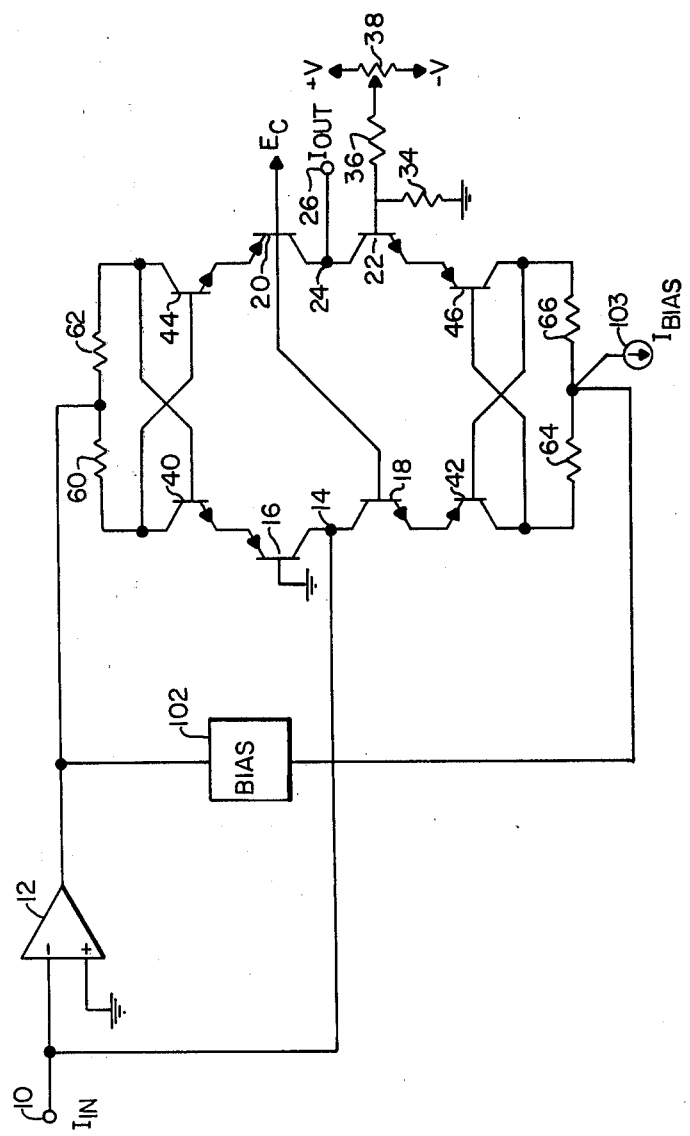
FIG. 5 shows the preferred embodiment for providing compensation to reduce distortion with the preferred biasing scheme for Class AB operation.

Class AB operation of the VCA cell of FIG. 4 can also be provided by the biasing scheme shown in FIG. 5. This embodiment is described in greater detail in the copending application filed simultaneously herewith by David R. Welland and me, Ser. No. 387,822 filed June 14, 1982, now U.S. Pat. No. 4,377,792. Generally, the FIG. 5 embodiment is the FIG. 4 embodiment modified so that the output of amplifier 12 is coupled directly to the junction of resistors 60 and 62. A bias generator 102 is connected between the junction formed by resistors 60 and 62 and the junction formed by resistors 64 and 66. Generator 102 is described in greater detail in the copending application filed simultaneously herewith by David R. Welland and me, Ser. No. 247,648, filed Mar. 26, 1981. Generally, generator 102 is of the type which provides an output bias voltage between the bases of transistors 48 and 52 as a function of a programmable current input to the generator such that the bias current which the generator causes to flow through the cell will be proportional to or equal to that programmable input current, independent of temperature. A current source 103 is also provided at the junction of resistors 64 and 66.

It should be appreciated that although the signal correction schemes have been shown in FIGS. 2–4 as being used in the Class AB amplifier of FIG. 1, they can be used in other types of amplifiers such as those of the Class A type by different biasing schemes. For example, as shown in FIG. 6, the voltage control amplifier of FIG. 4 is shown modified to be driven for Class A operation. Specifically, the output of amplifier 12 is connected to the inputs of two voltage controlled current sources 104 and 106, which in turn have their outputs respectively connected to the junction of resistors 60 and 62 and the junction of resistors 64 and 66.

In the arrangements of FIGS. 2–6, it should be appreciated that any mismatching between the parasitic base and emitter resistances of each compound set of log transistors and the respective compound set of antilog transistors can be easily corrected for by adjusting the values of resistors 60 and 62 and the values of resistors 64 and 66.

The present invention thus provides an improved gain control circuit suitable for Class AB operation such as shown in FIG. 1 and various schemes for correcting for the distortion component in the output signal of a gain cell attributable to the inherent parasitic base and emitter resistances of the transistor components in the log-antilog transmission paths. The correction schemes are an improvement over the prior art, and in particular the schemes shown in U.S. Pat. No. 4,234,804 since the means for correcting for signal distortion includes means in the form of the secondary transistors disposed in the log-antilog path so as to modify the respective signals in the path.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A gain control circuit for controlling the signal gain of an input signal in response to a control signal, said circuit comprising:

a pair of logarithmic-antilogarithmic transmission paths, one path for the signal portion of each representation of said input signal, each of said paths including (a) first signal converting means including first and second transistors for providing a first output signal as a logarithmic function of the respective portion of said input signal (b) second signal converting means including primary and secondary transistor for providing a second output signal as an antilogarithmic function of the sum of said first output signal and said gain control signal; means for generating a quiescent biasing current through said first and second signal converting means of each of said paths at levels below the maximum expected levels of the input signal and said second output signal of each of said paths; and means connected to said second and secondary transistors of each path for setting said biasing currents through the first and second signal converting means of each of said paths so that said circuit operates as a Class AB amplifier.

2. A circuit according to claim 1, wherein said second and secondary transistors, each has its collector and emitter connected to transmit the appropriate biasing current and corresponding signal and its base connected to respond to said input signal.

3. A circuit according to claim 2, wherein the base of the second transistor of each path is coupled to the base of the secondary transistor of the same path, said circuit further including means for biasing the bases of the second and secondary transistors of one path with respect to the bases of the second and secondary transistors of the other path.

4. A circuit according to claim 3, wherein said means for biasing includes means for maintaining a DC voltage potential between the bases of the second and secondary transistors of one path with respect to the bases of the second and secondary transistors of the other path.

5. A circuit according to claim 2, further including means for generating a compensating signal for each of said paths derived from a third signal as a function of said input signal of the path and a fourth signal as a function of said second output signal of the path and for adding said compensating signal to said first output signal so as to reduce the distortion in said second output signal.

6. A circuit according to claim 5, wherein said means for generating further includes a resistor in the collector circuit of each second transistor and each secondary transistor of each path, and means for providing correction in response to the voltage potential differential between the voltage across the resistor in the collector circuit of the second transistor of each path and the voltage across the resistor in the collector circuit of the secondary transistor of the same path.

7. A circuit according to claim 6, wherein the values of said resistors are a function of parasitic base and emitter resistances of said second and secondary transistors of the same path.

8. A circuit according to claim 5, wherein said means for generating comprises a pair of transistors for each path connected to said second and secondary transistors so as to generate a current in the base of each of the second and secondary transistors of each path.

9. A circuit according to claim 8, wherein the transistors of each pair are connected as a differential pair so as to provide said compensating signals as a function of the differential between the potentials at the collectors of the corresponding second and secondary transistors.

10. A circuit according to claim 5, wherein said means for generating further comprises a pair of resistors cross-connected between the collector of each one of said second and secondary transistors of one path to the base of the other of said second and secondary transistors of the same path.

11. A circuit according to claim 5, wherein said means for generating further comprises a direct cross-coupling between the collector of each one of said second and secondary transistors of one path to the base of the other of said second and secondary transistors of the same path.

12. A circuit according to claim 1, further including means for applying said control signal to the base of the first transistor of one path and the primary transistor of the other path.

13. A gain control circuit for controlling the signal gain of an input signal in response to a control signal, said circuit comprising:
a pair of log-antilog transmission paths, one path for the signal portion of each representation of said input signal, each of said paths including:
(a) first signal converting means for providing a first signal as a logarithm function of the respective portion of said input signal;
(b) second signal converting means for providing an output signal as an antilogarithmic function of the sum of the first signal and the control signal; and
(c) signal modification means disposed in each path for modifying said first signal and said output signal as a function of the input and output signals so as to reduce distortion in said output signal said signal modification means including means for generating, as a function of the input signal and the output signal, a correction signal through each of said first signal and second signal converting means.

14. A circuit according to claim 13, wherein each of said first signal converting means comprises a primary and a secondary transistors, and each of said second signal converting means comprises first and second transistors, wherein the collector current of the secondary transistor of each of said first signal converting means of each path is a function of the respective portion of said input signal, and the collector current of the second transistor of each of the second signal converting means is a function of the output signal.

15. A circuit according to claim 14, wherein a correction signal is generated through each of said primary and secondary transistors of said first signal converting means as a function of said input signal, and through each of said first and second transistors of said second signal converting means as a function of said output signal.

16. A circuit according to claim 15, wherein said signal modification means includes a pair of transistors each each of said paths, said pair of transistors being connected to provide a correction signal to the base of one of said first, second, primary and secondary transistors of each of said signal converting means in response to the detected signal level of the corresponding collector current of the second or secondary transistors of the same signal converting means.

17. A circuit according to claim 16, wherein each said pair of transistors is adapted to be driven by a common voltage source.

18. A circuit according to claim 14, wherein a correction signal is generated through each of said primary and secondary transistors of each first signal converting means and the first and second transistors of each second signal conversion means as a function of the difference between the collector current of the secondary transistor of the first signal converting means and the collector current of the second transistor of the corresponding second signal converting means of the same path.

19. A circuit according to claim 18, wherein said signal modification means includes a pair of transistors for each of said paths, said pair of transistors being connected to provide the correction signal to the base of one of said first, second, primary and secondary transistors of each of the first and second signal converting means in response to the difference in voltage levels of the collectors of the second and secondary transistors of the same path.

20. A circuit according to claim 19, wherein each pair of transistors is adapted to be connected to a common current source.

21. A circuit according to claim 18, wherein said signal modification means includes means for cross-coupling the base of each of the second and secondary transistors of the same path respectively with the corresponding collectors of the secondary and second transistors of that path so that the signal correction provided is a function of the difference between the voltages on the collectors of the second and secondary transistors of the same path.

22. A circuit according to claim 14, further including a resistor coupled to the collector of each of said second and secondary transistors, and the value of each said resistor is a function of any mismatching in the Vbe/Ic characteristics of the primary and secondary transistors of the first signal converting means with that of the Vbe/Ic characteristics of the first and second transistors of the second signal converting means of the same path.

23. A circuit according to claim 14, further including means for generating a biasing current through each of said first, second, primary and secondary transistors so that said circuit operates substantially as a Class AB device.

* * * * *

UNITED STATES PATENT AND TRADEMARK OFFICE
CERTIFICATE OF CORRECTION

PATENT NO. : 4403199

DATED : September 6, 1983

INVENTOR(S) : David E. Blackmer

It is certified that error appears in the above-identified patent and that said Letters Patent is hereby corrected as shown below:

Claim 1, column 13, line 9, delete "transistor", and substitute therefor -- transistors --.

Claim 16, column 14, line 62, delete "each" (first occurrence), and substitute therefor -- for --; and Claim 14, column 14, line 44, delete "transistors", and substitute therefor -- transistor --.

Signed and Sealed this

Twenty-seventh Day of December 1983

[SEAL]

Attest:

GERALD J. MOSSINGHOFF

Attesting Officer

Commissioner of Patents and Trademarks